United States Patent
Kawabata et al.

(10) Patent No.: US 12,144,160 B2
(45) Date of Patent: Nov. 12, 2024

(54) HOUSING

(71) Applicants: KAWABATA MFG CO., LTD., Tokyo (JP); Tatsuya Takemoto, Kanagawa (JP); Hane Inc., Tokyo (JP)

(72) Inventors: Kodo Kawabata, Tokyo (JP); Tatsuya Takemoto, Kanagawa (JP); Kunio Hane, Tokyo (JP)

(73) Assignees: KAWABATA MFG CO., LTD., Tokyo (JP); Tatsuya Takemoto, Kanagawa (JP); Hane Inc., Tokyo (JP)

( * ) Notice: Subject to any disclaimer, the term of this patent is extended or adjusted under 35 U.S.C. 154(b) by 0 days.

(21) Appl. No.: 18/244,505

(22) Filed: Sep. 11, 2023

(65) Prior Publication Data

US 2023/0422455 A1    Dec. 28, 2023

Related U.S. Application Data

(62) Division of application No. 17/508,558, filed on Oct. 22, 2021, now abandoned.

(30) Foreign Application Priority Data

Feb. 17, 2021 (JP) .................................. 2021-23288
Jun. 4, 2021 (JP) .................................. 2021-94017

(51) Int. Cl.
| | |
|---|---|
| H05K 9/00 | (2006.01) |
| H05K 5/00 | (2006.01) |
| H05K 5/04 | (2006.01) |
| G06F 1/16 | (2006.01) |

(52) U.S. Cl.
CPC ......... H05K 9/0049 (2013.01); H05K 5/0021 (2013.01); H05K 5/04 (2013.01); *G06F 1/16* (2013.01); *G06F 1/1613* (2013.01)

(58) Field of Classification Search
CPC ...... H05K 9/0049; H05K 5/0021; H05K 5/04; G06F 1/16; G06F 1/1613
USPC .......................................................... 361/600
See application file for complete search history.

(56) References Cited

U.S. PATENT DOCUMENTS

| | | | | |
|---|---|---|---|---|
| 2010/0266246 | A1* | 10/2010 | van Haaster | G02B 6/4277 385/94 |
| 2018/0279516 | A1* | 9/2018 | Lee | B32B 15/013 |
| 2020/0315072 | A1* | 10/2020 | Howland | B32B 15/20 |

FOREIGN PATENT DOCUMENTS

CN        112259281 A  *  1/2021  ............... H01B 5/14

* cited by examiner

*Primary Examiner* — Zhengfu J Feng
(74) *Attorney, Agent, or Firm* — Nakanishi IP Associates, LLC

(57) ABSTRACT

Provided is a housing that effectively serves to block high-frequency electromagnetic waves in addition to low-frequency electromagnetic waves. A housing that houses an electronic or electric device includes at least one of a copper layer serving as a diamagnetic layer and a nickel layer serving as a ferromagnetic layer, stacked on each of front and back sides of an iron base member, and a bright tin layer further stacked thereon as an outermost layer.

10 Claims, 5 Drawing Sheets

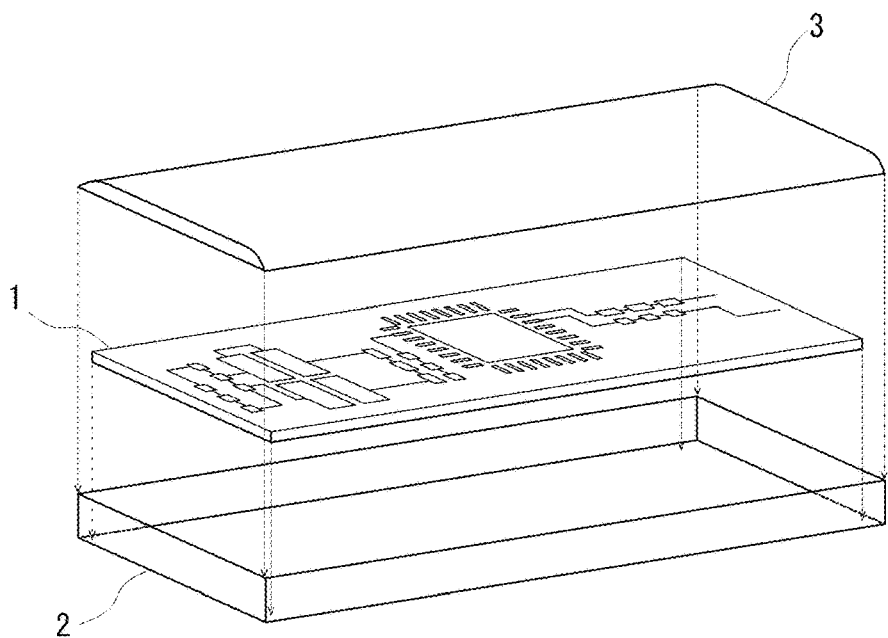
FIG.1
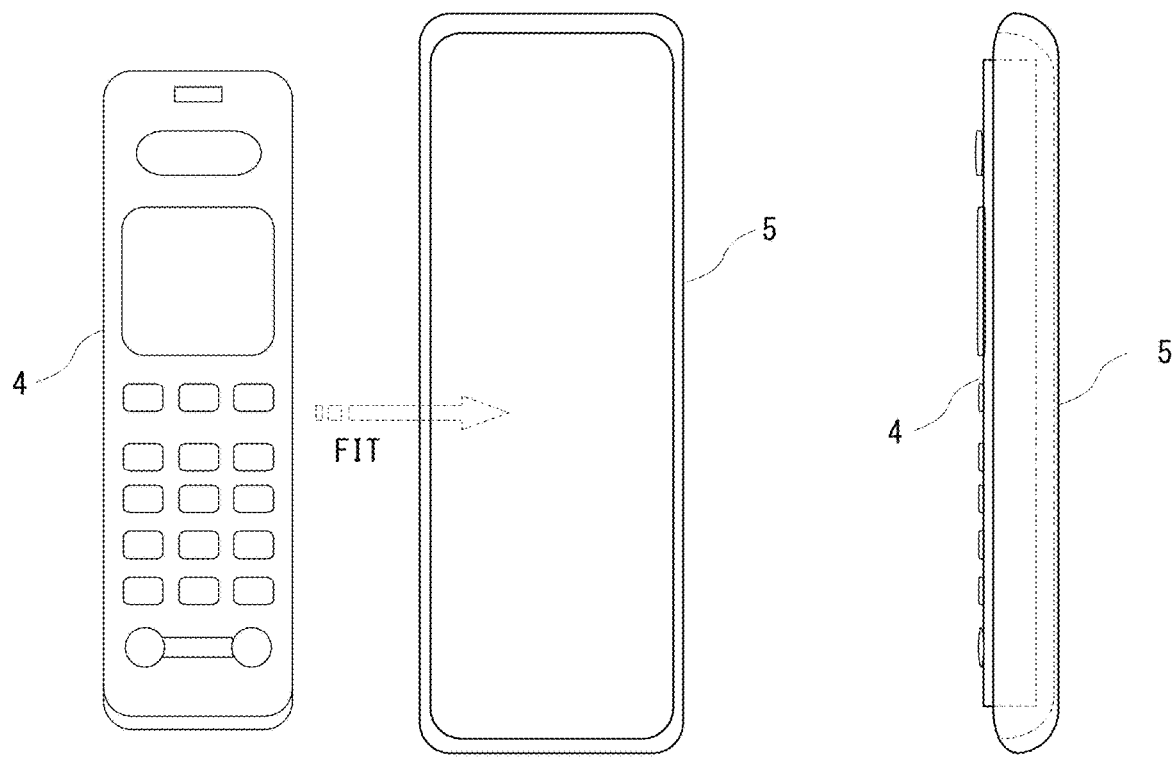
FIG. 2A
FIG. 2B

| | | |
|---|---|---|
| PLATED LAYER (BRIGHT TIN) | 1 μm ~ | 3 μm |
| PLATED LAYER (COPPER) | 1 μm ~ | 10 μm |
| PLATED LAYER (NICKEL) | 1 μm ~ | 10 μm |
| PLATED LAYER (COPPER) | 1 μm ~ | 10 μm |
| BASE MEMBER (IRON) | 0.1 mm ~ | 0.5 mm |
| PLATED LAYER (COPPER) | 1 μm ~ | 10 μm |
| PLATED LAYER (NICKEL) | 1 μm ~ | 10 μm |
| PLATED LAYER (COPPER) | 1 μm ~ | 10 μm |
| PLATED LAYER (BRIGHT TIN) | 1 μm ~ | 3 μm |

FIG. 7

| | | |
|---|---|---|
| PLATED LAYER (BRIGHT TIN) | 1 μm ~ | 3 μm |
| PLATED LAYER (NICKEL) | 1 μm ~ | 10 μm |
| PLATED LAYER (COPPER) | 1 μm ~ | 10 μm |
| PLATED LAYER (NICKEL) | 1 μm ~ | 10 μm |
| BASE MEMBER (IRON) | 0.1 mm ~ | 0.5 mm |
| PLATED LAYER (NICKEL) | 1 μm ~ | 10 μm |
| PLATED LAYER (COPPER) | 1 μm ~ | 10 μm |
| PLATED LAYER (NICKEL) | 1 μm ~ | 10 μm |
| PLATED LAYER (BRIGHT TIN) | 1 μm ~ | 3 μm |

FIG. 8

HOUSING

CROSS-REFERENCE TO RELATED APPLICATIONS

This application is a divisional application of U.S. patent application Ser. No. 17/508,558, which claims the benefit of priority from the prior Japanese Patent Application No. 2021-23288, filed Feb. 17, 2021, and the prior Japanese Patent Application No. 2021-94017, filed Jun. 4, 2021, the entire contents of which are incorporated herein by reference.

FIELD

Embodiments of the present invention relates to housings that house electric or electronic devices.

BACKGROUND (Characteristics of Magnetic Field Sources)

We are surrounded by a wide variety of electric and electronic devices. Electric and electronic devices are magnetic field sources that generate low-frequency or high-frequency electromagnetic waves. For example, high-frequency devices such as communication devices and mobile phones generate high-frequency electromagnetic waves. Voltage conversion inverters for power supply circuits, motor-driving inverters for driving motors, and other power supply circuits in apparatuses such as home electric appliances, electric vehicles, hybrid vehicles, and electrically assisted pedal cycles generate electromagnetic waves of relatively low frequencies.

The magnetic fields may leak due to the power supply circuits and the motor bodies, batteries and power supplies that power these power supply circuits and motor bodies, and current flowing through these components during regeneration. Magnetic field sources vary from low-power to high-power sources over a wide range from 50 Hz to 100 kH.

Any of the above inverters is based on the same power control principle to control power by changing the pulse width, i.e., pulse-width modulation (PWM) or by changing the pulse frequency, i.e., frequency modulation (PFM). Magnetic fields are generated not only by inverter circuits for motors and pulse sources acting as loads, but also by wires and batteries of the circuits. In an electric vehicle, a magnetic field generated by current flowing from a motor to a battery for regenerative braking is even larger than a magnetic field generated during acceleration. Further, because the inverters are pulse-controlled, electromagnetic interference exceeding 1 MHz may occur due to the basic frequency as well as high-frequency components of harmonics.

(Medical Reports on Medical Problems Caused by Magnetic Fields)

In closer proximity to a magnetic field source of such an electrically powered device or electric vehicle, a user is exposed to a higher magnetic field strength. This is because of the inverse-square law, according to which an electromagnetic wave propagates inversely with the square of the distance. In addition, the magnetic field induces current in wires in nearby devices and causes interference.

The magnetic field strength for human bodies is regulated by a guideline issued by the World Health Organization (WHO). Japan EMF Information Center (JEIC) has presented a medical research paper about this problem (Non-Patent Literature 1).

The above guideline and paper are focused on intensive exposure for a short period. Other epidemiologic studies have reported the influences of low-frequency magnetic fields during less intensive long-term exposure. We should note a report on childhood leukemia in relation to a magnetic field of 50 Hz, which is three orders of magnitude lower than the value specified in the guideline (Non-Patent Literature 2), and a report on influences in low-frequency bands (Non-Patent Literature 3).

To address the above problems, passive methods have been used, such as reducing a generated magnetic field by lowering the current value of the magnetic field source, or by adjusting wiring. If such passive methods do not work sufficiently, the magnetic field source is magnetically shielded to reduce the magnetic field strength.

(Measuring Shielding Characteristics of Magnetic Shielding Materials)

Physical constants of metallic materials such as the relative permeability are functions of frequency, and thus the magnetic shielding efficiency of a metal depends on the frequency. A common method of measuring the magnetic shielding efficiency of a metal is the KEC method, in which the shielding effect is measured by placing a measured object between a transmitting element and a receiving element facing each other under a near-field condition (Non-Patent Literature 4). Another method is the Advantest method, in which a transmitting element and a receiving element disposed side by side are used to receive an electromagnetic wave of a transmission wave reflected off a measured object (Non-Patent Literature 5).

The above methods both measure the shielding efficiency basically in bands of 1 MHz and higher; the KEC method incompletely addresses measurement in bands lower than 1 MHz. Examples of shielding efficiency have been reported only for major metallic materials, and effects of surface processing on the shielding efficiency have not been measured industrially nor academically.

To control a magnetic field to reduce interference with an electric or electronic device or reduce the exposure dose to a human body, the following methods may be taken: surrounding the magnetic field source with a magnetic shielding material to prevent leakage of the magnetic field, or placing a shielding material between the magnetic field source and the target device, circuit, or person. Magnetic shielding may involve reflecting or absorbing the magnetic field. The present invention uses the reflection approach, which allows the shielding material to be thin and lightweight.

To block magnetic fields, iron-based materials with high relative permeability have been used. An iron material, however, requires a thickness of 1 mm for setting (increasing) a shielding efficiency at 1 kHz against magnetic field to ten times (−20 dBm). As a prior example of using a metal other than iron, Patent Literature 1 describes an alloy material of copper and iron. This is aimed at obtaining both the electric field shielding ability resulting from the high conductivity of copper and the magnetic shielding effect of the iron material.

Patent Literature 2 describes a magnetic shielding material produced by using iron as a base member, plating a ferromagnetic substance such as nickel on a diamagnetic substance such as copper, and alloying these layers at a high temperature. This magnetic shielding material lacks a magnetic shielding effect provided by a diamagnetic substance, and cannot be regarded as having a laminated structure because of the alloying processing after the plating.

Patent Literature 3 describes a soft magnetic thin film of an alloy of iron and nickel. The thin film is produced by alternately plating iron and nickel to form a multilayer thin film and subjecting it to thermal treatment to diffuse metal atoms of the materials. This thin film lacks a diamagnetic substance in the structure, and cannot be regarded as having a laminated structure because of the alloying processing.

CITATION LIST

Non-Patent Literature

[Non-Patent Literature 1]
Japan EMF Information Center, "Results of epidemiologic study on extremely low frequency electromagnetic fields and childhood leukemia" in the Internet <URL:https://www.jeic-emf.jp/explanation/1030.html>
[Non-Patent Literature 2]
Kabuto et al. "Childhood leukemia and magnetic fields in Japan: A case-control study of childhood leukemia and residential power-frequency magnetic fields in Japan." International Journal of Cancer, 119 (3), pp. 643-650 (2006)
[Non-Patent Literature 3]
Toshiya Tomioka, et al., (1998) Influences of low-frequency electromagnetic waves on mice. Japanese Journal of Clinical Ecology 7: 80-86
[Non-Patent Literature 4]
Mihoko Igarashi, et al., "Method of evaluating electromagnetic wave absorbing sheets and shielding materials," Tokyo Metropolitan Industrial Technology Research Institute, study report vol. 3, 2008
[Non-Patent Literature 5]
R17303 EMI Probe Set instruction manual, Advantest Corporation, 1993 edition

PATENT LITERATURE

[Patent Literature 1]
Japanese Patent Laid-Open No. 2007-49104
[Patent Literature 2]
Japanese Patent Laid-Open No. 57-202706
[Patent Literature 3]
Japanese Patent Laid-Open No. 6-346276

SUMMARY OF THE INVENTION

An object is to provide a housing that effectively serves to block high-frequency electromagnetic waves in addition to low-frequency electromagnetic waves.

A housing that houses an electronic or electric device according to an embodiment includes at least one of a diamagnetic layer and a ferromagnetic layer, stacked on each of front and back sides of a base member, and a bright tin layer formed thereon as an outermost layer.

BRIEF DESCRIPTION OF THE VIEWS OF THE DRAWING

FIG. 1 shows a housing that houses a high-frequency circuit substrate as an exemplary housing according to the present invention;
FIGS. 2A and 2B shows a housing that houses a high-frequency device (mobile phone), in particular the back surface of the device, as an exemplary housing according to the present invention;
FIG. 7 is a cross-sectional view of a housing according to a third embodiment;
FIG. 8 is a cross-sectional view of a variation of the housing shown in FIG. 7.

DETAILED DESCRIPTION

Figure 3:
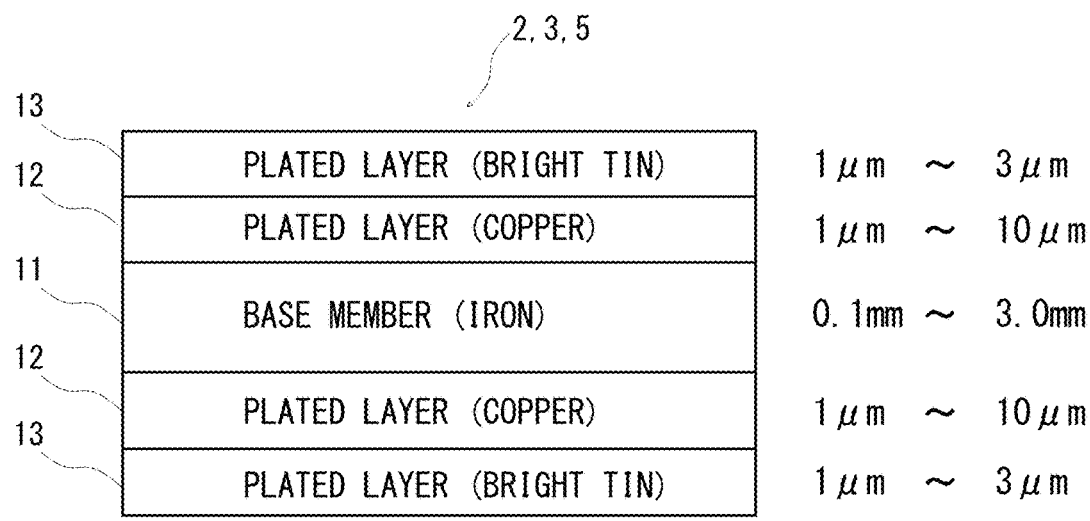
FIG. 3 is a cross-sectional view of a housing according to a first embodiment.

A housing that houses an electronic or electric device according to the present invention will be described below with reference to the drawings. The housing according to the present invention, although being relatively thin, effectively serves to block high-frequency electromagnetic waves in addition to low-frequency electromagnetic waves. The electronic or electric device may be, for example, a high-frequency device such as a communication device or a mobile phone. The electronic or electric device may also be, for example, a voltage conversion inverter for a power supply circuit, a motor-driving inverter for driving a motor, or some other motor or power supply circuit in an apparatus such as a home electric appliance, an electric vehicle, a hybrid vehicle, or an electrically assisted pedal cycle. The electronic or electric device may also be, for example, a magnetic field source or radiation source of a medical device, such as a magnetic resonance imaging (MRI) device or a radiation therapy device.

As shown in FIG. 1, for example, the housing may include a box part 2 and a lid part 3 that house a high-frequency circuit substrate 1. As shown in FIGS. 2A and 2B, for example, the housing may be provided as a cover 5 that covers the back surface of a mobile phone 4, which is a high-frequency device. The magnetic field shielding effect of the housing can be used to reduce the exposure dose to a hand resulting from a magnetic field generated by a switching regulator in the mobile phone 4. For example, a metal thin plate used for the housing is formed as follows. Nickel is plated to a thickness of about 2 µm on both sides of a 0.3-mm-thick iron plate, and copper is further plated thereon to a thickness of about 2 µm, and tin is plated thereon to a thickness of about 2 µm for surface protection. A 1-mm-thick silicone rubber case is attached to the "body" of the mobile phone 4 to be shielded, and the mobile phone 4 is fitted into the housing clinched with a clearance of 2 mm to conform to the case. This achieves a structure that prevents the magnetic field of the mobile phone from reaching the user's hand.

The housing herein shields the electronic or electric device inside to block electromagnetic fields of relatively low frequencies, as well as electromagnetic fields of relatively high frequencies equal to or higher than 100 kHz.

To block low-frequency electromagnetic waves, the structure of the housing includes at least one of, or preferably both of, a diamagnetic layer that drives out a magnetic flux by inducing eddy currents, and a ferromagnetic layer with a high relative permeability that confines magnetic fields permeating the material. Further, to reflect high-frequency electric fields, a good conductor with a smooth surface, typically a bright tin layer, is formed as the outermost layer (a surface layer).

The ferromagnetic layer may be an iron layer, a nickel layer, or a cobalt layer. The diamagnetic layer may be a copper layer, a tin layer, or a carbon layer.

If the iron constituting the base member of the magnetic shielding material has a thickness of 0.1 mm or greater, a metal layer of the diamagnetic substance, such as copper, having a thickness of 1 to 10 µm is stacked on each side of the iron, which is a ferromagnetic substance. Further, a nonmagnetic substance, such as tin, having a thickness of 1µ or greater is stacked for surface protection. A good shielding effect of this structure has been proved by the result of actual measurement in a first embodiment to be described later.

If weight reduction is a high priority, a ferromagnetic nickel layer having a thickness of 1 to 10 µm is formed between the iron plate of the base member and the diamagnetic copper described above, and tin is further stacked for surface protection. Although nickel has a relative permeability that is one order of magnitude lower than iron, nickel has an electrical conductivity higher than iron and therefore diamagnetically acts by inducing eddy currents in a low-frequency range of 1 MHz and below. Actual measurement has shown that nickel is ferromagnetic in bulk form but has a diamagnetic effect in thin film form. A good shielding effect of this structure has been proved by the result of actual measurement in a second embodiment to be described below.

For further weight reduction, the iron constituting the base member is further thinned to reduce weight, and a nickel layer is stacked on the iron to enhance the shielding effect of the iron as a ferromagnetic substance. Copper is further stacked thereon for combined diamagnetic effects of the nickel and copper. In this manner, the nickel layer and the copper layer are repeatedly stacked to increase the shielding efficiency, and lastly, tin is stacked for surface protection.

As a material for blocking magnetic fields in low-frequency bands, a diamagnetic layer, typically a copper layer, is stacked on each side of the iron base member serving as a ferromagnetic layer, thereby achieving a shielding effect. The diamagnetic substance induces eddy currents with respect to an external magnetic field, and the eddy currents reflect the external magnetic field to provide the shielding effect. To this end, a material with a small resistivity and a thickness of several to 10 µm is used as the diamagnetic material on each side. If the iron material constituting the base member is 0.5 mm thick, it reduces the magnetic field strength to 17% or lower in combination with the two layers on both sides. This structure thus achieves a shielding effect above 15.4 dBm in a frequency band of 1 to 100 kHz.

For frequency bands of 100 kHz and higher, reflecting electric fields is effective for blocking electromagnetic waves. A good conductor with a smooth surface may be used as the material for reflecting electric fields. Thus, a shielding effect can be achieved by a laminated structure including diamagnetic copper, ferromagnetic nickel, and bright tin for surface protection.

Current flowing through a power-supply inverter or a motor in a home electric appliance, an electric vehicle, or a hybrid vehicle may generate electromagnetic waves of 50 Hz to 100 kHz. For such electromagnetic waves, the plate materials as above may be used as shielding materials that act on magnetic fields to reduce the electromagnetic waves. According to actual measurement of effects, compared with an iron material having the same thickness, a 1.0-mm-thick iron material with 5-µm-thick copper plated thereon achieved an increase of 10% or higher in average in shielding efficiency in the frequency range of 400 Hz to 60 kHz, which is often used by inverters.

First, the structure of an object to be magnetically shielded may be formed, and then a laminated structure, such as a plated structure, providing a shielding effect may be built onto the object. This allows the use of conventional production methods without requiring modifications.

First Embodiment

FIG. 3 shows a cross-sectional structure of a housing according to a first embodiment. A base member 11, which is typically made of iron, forms a ferromagnetic layer having a thickness between 0.1 and 3.0 mm. A copper layer 12 having a thickness between 1 and 10 µm is formed by plating as a diamagnetic layer on each of the front and back sides of the base member 11. A bright tin layer 13 having a thickness between 1 and 3 µm is formed by plating on the surface of the copper layer 12.

The copper layer 12 may be replaced with a carbon layer that also serves as a diamagnetic layer. The plating may be replaced with thermal spraying, evaporation, or printing.

The base member 11 and the copper layers 12 achieve a shielding effect against electromagnetic waves in lower frequency bands, whereas the bright tin layers 13 achieve a shielding effect against electromagnetic waves in higher frequency bands. The bright tin layers 13 also function as protection layers against damage, such as collisions with external objects.

Typically, the copper layer 12 having a thickness of about 2 µm is plated on each side of the 0.5-mm-thick iron base member 11, and the bright tin layer 13 having a thickness of about 0.1 µm is plated on the copper layer 12 to provide a smooth surface. The bright tin layer 13 prevents oxidation of the copper layer 12, protects the housing against physical damage such as collisions with external objects, and further achieves a reflective shielding effect against high-frequency electromagnetic waves.

Figure 4:
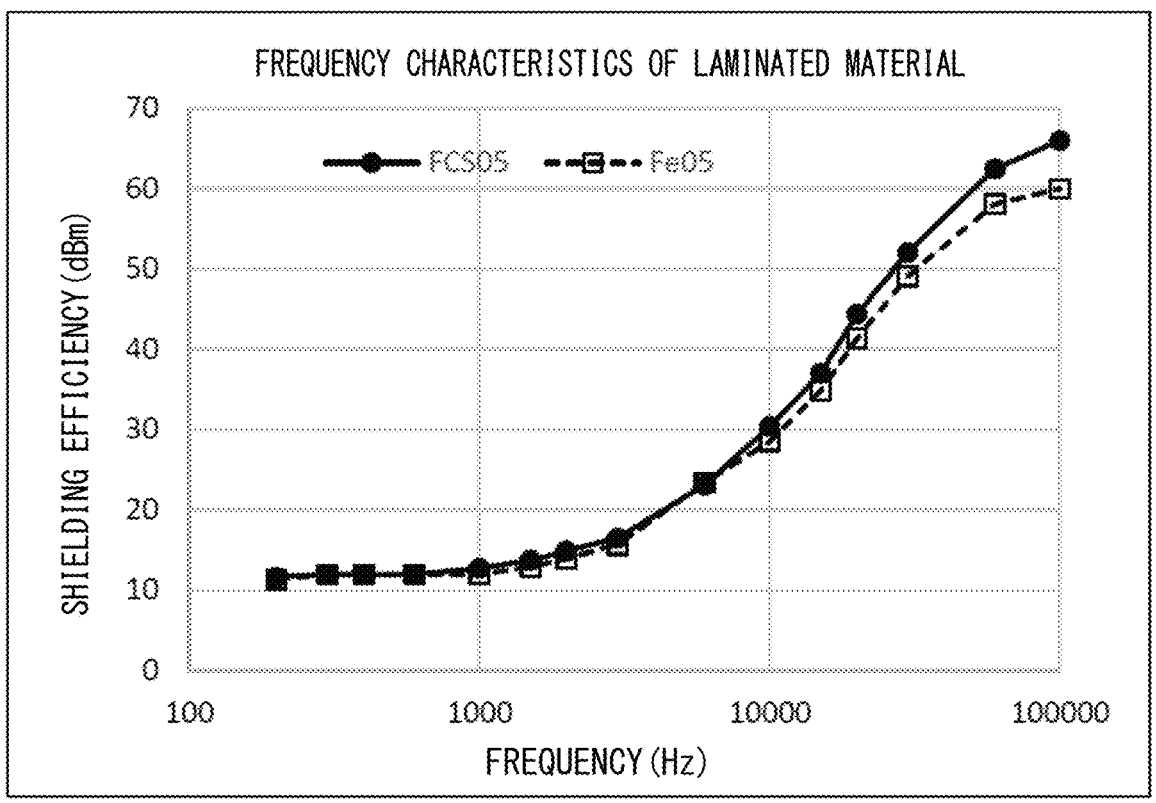
FIG. 4 shows a shielding effect of the housing shown in FIG. 3.

FIG. 4 shows frequency characteristics (FCS05) of the shielding efficiency actually measured for the above material. Compared with the frequency characteristics (Fe05) of an iron material indicated by a dashed line, the measurement shows a shielding effect of about 1 dBm in the frequency range of 100 Hz to 1 kHz. By contrast, in the frequency range of 10 to 100 kHz, in which inverters typically operate, the measurement shows a shielding effect of 6 dBm (two times higher in terms of real number value). This suggests that the thickness of the iron material can be halved, indicating a significant effect from the perspective of cost or weight reduction. The measured structure included an iron plate made of soft iron without any additives, and high-purity copper and tin for electroplating.

Second Embodiment

Figure 5:
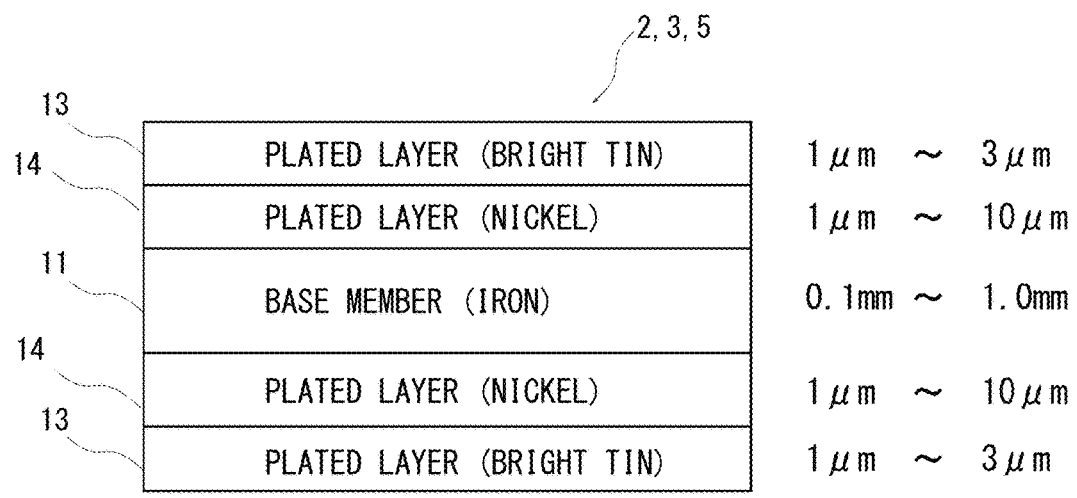
FIG. 5 is a cross-sectional view of a housing according to a second embodiment.

FIG. 5 shows a cross-sectional structure of a housing in a second embodiment. For weight reduction, a base member 11 in this embodiment forms a relatively thin ferromagnetic layer having a thickness between 0.1 and 1.0 mm. To enhance the shielding effect, a nickel layer 14 having a thickness between 1 and 10 µm is formed by plating as a ferromagnetic layer on each of the front and back sides of the base member 11. A bright tin layer 13 having a thickness between 1 and 3 µm is formed by plating as a diamagnetic layer on the surface of the nickel layer 14. The nickel layer 14 may be replaced with a cobalt layer that also serves as a ferromagnetic layer.

The base member 11 and the nickel layers 14 achieve a shielding effect against low-frequency electromagnetic waves, whereas the bright tin layers 13 achieve a shielding effect against high-frequency electromagnetic waves. The bright tin layers 13 also function as protection layers against damage, such as collisions with external objects.

Figure 6:
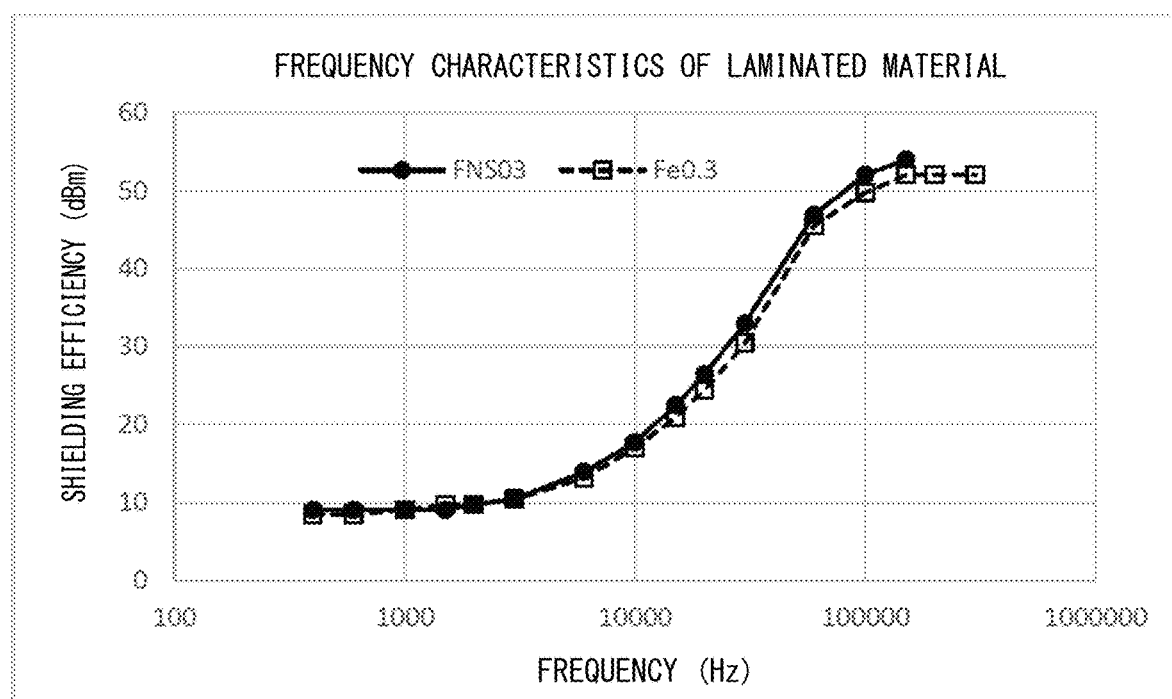
FIG. 6 shows a shielding effect of the housing shown in FIG. 5.

Typically, the nickel layer 14 having a thickness of about 2 μm is plated on each side of the 0.3-mm-thick iron base member 11, and, as in the first embodiment, the tin layer 13 having a thickness of about 2 μm is plated on the nickel layer 14 to provide a smooth surface. FIG. 6 shows frequency characteristics (FNS03) of the shielding efficiency actually measured for the above material. Compared with the frequency characteristics (Fe03) of an iron material indicated by a dashed line, the measurement shows no difference in the frequency range of 100 Hz to 10 kHz. By contrast, in the frequency range of 30 kHz and higher, the measurement shows a shielding effect of 3 dBm (1.4 times higher in terms of real number value) at the maximum. This suggests that the thickness of the iron material can be reduced to 70%, which will have an effect of cost reduction or weight reduction.

Third Embodiment

For a relatively thin base member 11, for example having a thickness between 0.1 and 0.5 mm, a nickel layer 14 may be stacked on a copper layer 12 to achieve an effective shielding function especially for low-frequency electromagnetic waves.

As shown in FIG. 7, a copper layer 12 having a thickness between 1 and 10 μm is formed by plating on each of the front and back sides of an iron base member 11. A nickel layer 14 having a thickness between 1 and 10 μm is stacked by plating on the surface of the copper layer 12. Further, another copper layer 12 having a thickness between 1 and 10 μm is stacked by plating on the surface of the nickel layer 14, and a bright tin layer 13 having a thickness between 1 and 3 μm is formed by plating on the surface of the copper layer 12.

Alternatively, as shown in FIG. 8, a nickel layer 14 having a thickness between 1 and 10 μm is formed by plating on each of the front and back sides of an iron base member 11. A copper layer 12 having a thickness between 1 and 10 μm is stacked by plating on the surface of the nickel layer 14. Further, another nickel layer 14 having a thickness between 1 and 10 μm is stacked by plating on the surface of the copper layer 12, and a bright tin layer 13 having a thickness between 1 and 3 μm is formed by plating on the surface of the nickel layer 14.

Fourth Embodiment

If the magnetic-shielding case or housing has a complicated shape, forming the base member out of iron may be difficult. For low-volume production, a steel mold required for processing (such as stamping) of iron base members may increase the production cost.

Figure 9:
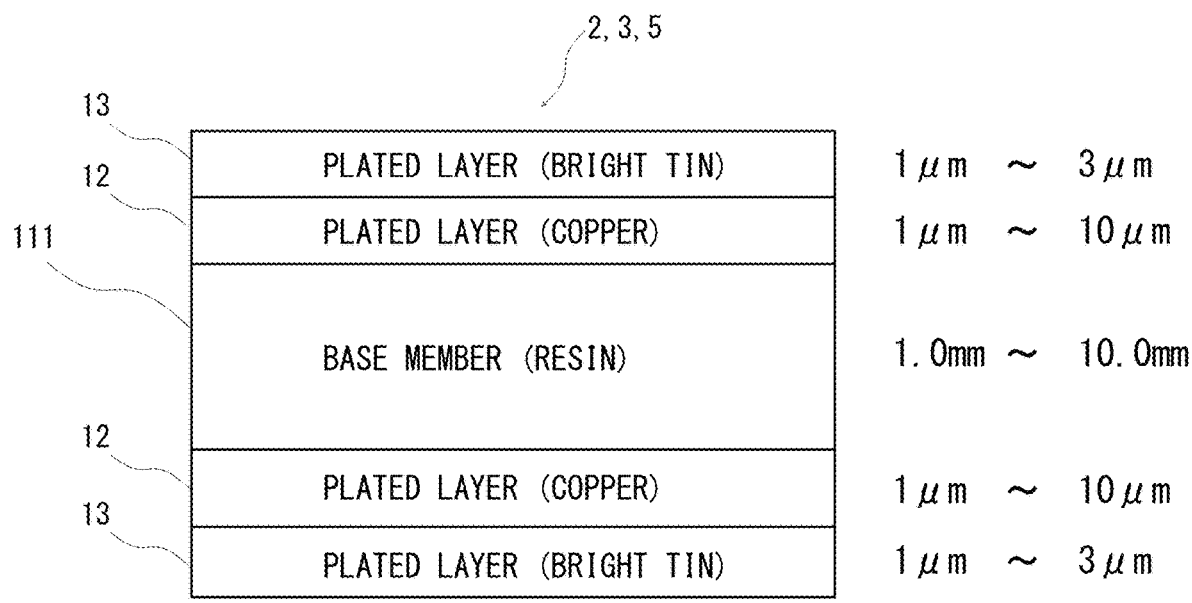
FIG. 9 is a cross-sectional view of a housing according to a fourth embodiment.

As shown in FIG. 9, a base member 111 of a housing according to this embodiment is made of a resin such as polyamide (PA), polycarbonate (PC), or polyacetal (POM). The resin base member 111 can be injection-molded, allowing a complicated shape and also reducing the production cost. The base member 111 may also be made of wax or nonferrous metal.

Having the resin base member 111, the housing according to this embodiment does not achieve the effect of "confining magnetic fields permeating the material" that would be provided by a ferromagnetic layer with a high relative permeability. This housing, however, can achieve the low-frequency electromagnetic wave shielding effect of "driving out a magnetic flux by inducing eddy currents" provided by the diamagnetic layers, and the high-frequency electromagnetic field shielding effect provided by the bright tin layers reflecting electromagnetic waves.

Although FIG. 9 shows the cross-sectional structure corresponding to FIG. 3, this embodiment includes structures in which the base members in the cross-sectional structures in FIGS. 5, 7, and 8 are replaced with a resin base member.

Fifth Embodiment

Figure 10:
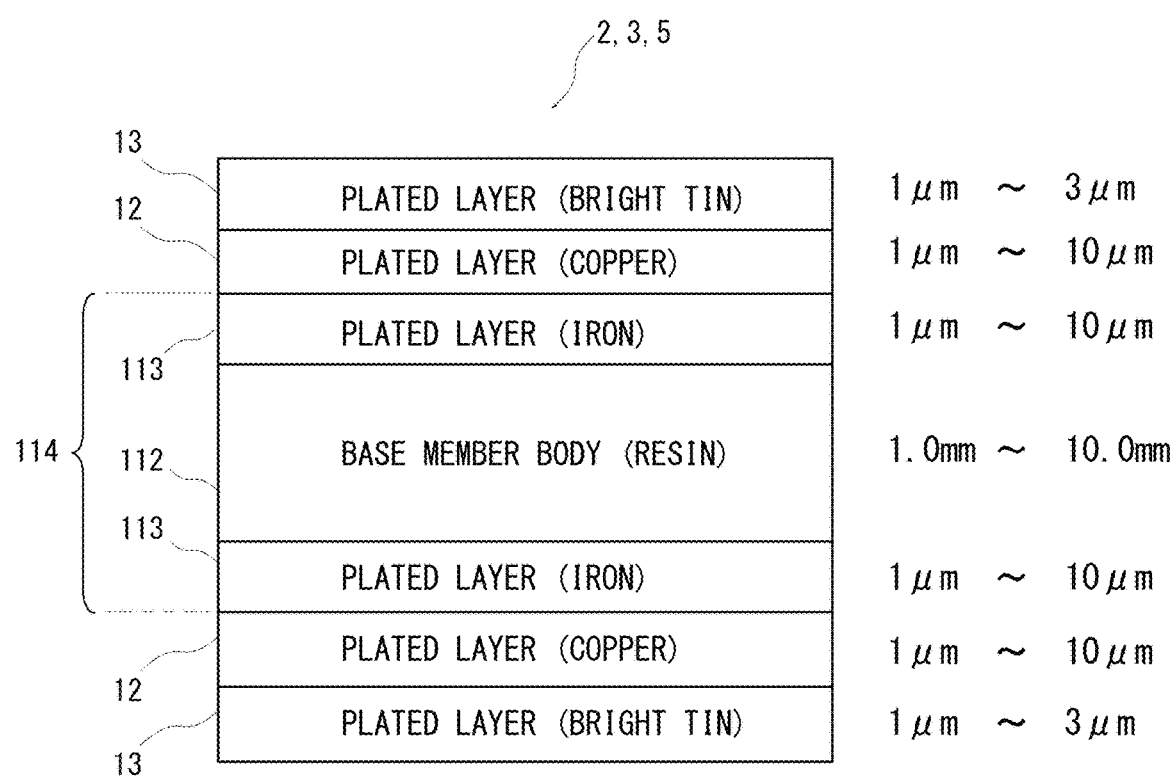
FIG. 10 is a cross-sectional view of a housing according to a fifth embodiment.

As shown in FIG. 10, a base member 114 of a housing according to this embodiment includes a resin base member body 112 between 1.0 and 10.0 mm in thickness, and iron ferromagnetic layers 113 between 1 and 10 μm in thickness stacked by plating or thermal spraying on both the front and back sides of the base member body 112. The base member body 112 may be made of wax or nonferrous metal.

The housing according to this embodiment includes the base member 114 having the laminated structure of the resin layer 112 and the ferromagnetic layers 113. The housing can therefore achieve, although not significantly, the effect of "confining magnetic fields permeating the material" provided by the ferromagnetic layers. The housing can further achieve the low-frequency electromagnetic wave shielding effect of "driving out a magnetic flux by inducing eddy currents" provided by the diamagnetic layers, and the high-frequency electromagnetic field shielding effect provided by the bright tin layers reflecting electromagnetic waves.

Although FIG. 10 shows the cross-sectional structure corresponding to FIG. 3, this embodiment includes structures in which the base members in the cross-sectional structures in FIGS. 5, 7, and 8 are replaced with the base member 114 having the base member body (resin layer) 112 and the iron layers (ferromagnetic layers) 113 stacked together.

The housing according to the fourth embodiment includes the resin base member 111, and the housing according to the fifth embodiment includes the resin base member body 112. After the completion of producing the laminated structure of the housing according to the fourth or fifth embodiment, the resin constituting the base member 111 or the base member body 112 may be removed with a solvent or heat. This yields a laminated structure of the remaining copper layers and bright tin layers, a laminated structure of the remaining nickel layers and bright tin layers, or a laminated structure of the remaining copper layers, nickel layers, and bright tin layers. This can be used as a lightweight and elastic functional structure material (thin film material) having a magnetic shielding function. In this case, the resin layer may be replaced with a wax material layer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

REFERENCE SIGNS LIST

11 . . . base member, 12 . . . copper layer, 13 . . . bright tin layer, 14 . . . nickel layer

The invention claimed is:

1. A housing that houses an electronic or electric device, comprising:
a base member having front and back sides;
a diamagnetic layer and a ferromagnetic layer stacked on each of the front and back sides of the base member;
another diamagnetic layer stacked on the ferromagnetic layer, the another diamagnetic layer and the ferromagnetic layer being in direct contact with one another; and
a bright tin layer stacked as an outermost layer on the another diamagnetic layer, the bright tin layer and the another diamagnetic layer being in direct contact with one another.

2. The housing according to claim 1, wherein the base member is made of iron.

3. The housing according to claim 1, wherein the diamagnetic layer is a copper layer.

4. The housing according to claim 3, wherein the base member has a thickness of 0.1 to 3 mm, and the copper layer has a thickness of 1 to 10 µm.

5. The housing according to claim 1, wherein the ferromagnetic layer is a nickel layer.

6. The housing according to claim 5, wherein the base member has a thickness of 0.1 to 3 mm, and the nickel layer has a thickness of 1 to 10 µm.

7. The housing according to claim 1, wherein the ferromagnetic layer is stacked on each of the front and back sides of the base member, the diamagnetic layer is stacked on the ferromagnetic layer, and another ferromagnetic layer is stacked on the diamagnetic layer.

8. The housing according to claim 1, wherein the base member is made of resin.

9. The housing according to claim 1, wherein the base member comprises: a base member body made of resin; and an iron layer formed on each of front and back sides of the base member body.

10. The housing according to claim 1, wherein the diamagnetic layer is a tin layer, or a carbon layer, and the ferromagnetic layer is a nickel layer, or a cobalt layer.

* * * * *